US009504180B2

(12) United States Patent
Lütze et al.

(10) Patent No.: US 9,504,180 B2
(45) Date of Patent: Nov. 22, 2016

(54) MOUNTING SYSTEM FOR ARRANGING ELECTRIC DEVICES, FOR EXAMPLE, ESPECIALLY IN SWITCHGEAR CABINETS

(71) Applicant: Friedrich Lütze GmbH, Weinstadt-Grossheppach (DE)

(72) Inventors: Udo Lütze, Kernen-Stetten (DE);
(Continued)

(73) Assignee: FRIEDRICH LUTZE GMBH, Weinstadt-Grossheppach (DE)

( * ) Notice: Subject to any disclaimer, the term of this patent is extended or adjusted under 35 U.S.C. 154(b) by 0 days.

(21) Appl. No.: 14/416,847

(22) PCT Filed: Jul. 25, 2013

(86) PCT No.: PCT/EP2013/002208
§ 371 (c)(1),
(2) Date: Jan. 23, 2015

(87) PCT Pub. No.: WO2014/015986
PCT Pub. Date: Jan. 30, 2014

(65) Prior Publication Data
US 2015/0181742 A1    Jun. 25, 2015

(30) Foreign Application Priority Data
Jul. 25, 2012    (DE) ........................ 10 2012 014 975

(51) Int. Cl.
*H05K 7/14*    (2006.01)
*H05K 7/18*    (2006.01)
(Continued)

(52) U.S. Cl.
CPC .............. *H05K 7/142* (2013.01); *H02B 1/052* (2013.01); *H02B 1/202* (2013.01); *H05K 7/183* (2013.01)

(58) Field of Classification Search
CPC ............. H02B 1/205; H02B 1/21; H02B 1/22; H02B 1/052; H02B 1/20; H02B 1/202; H05K 7/142; H05K 7/183
(Continued)

(56) References Cited

U.S. PATENT DOCUMENTS 2,441,485 A * 5/1948 Graves, Jr. ................ H02B 1/21
                                                        361/631
3,148,311 A * 9/1964 Sterns .................... H02B 1/052
                                                        361/832
(Continued)

FOREIGN PATENT DOCUMENTS

DE    23 30 166 A1    1/1975
DE    27 58 782 A1    7/1979
(Continued)

*Primary Examiner* — Michael Safavi
(74) *Attorney, Agent, or Firm* — Wenderoth, Lind & Ponack, L.L.P.

(57) ABSTRACT

A mounting system (1) arranges electric devices (2), especially in switchgear cabinets. The mounting system (1) includes at least one preferably horizontal mounting strip (3) to which at least one device (2) can be secured. An ordering assembly (8) can be connected to the mounting strip (3) and used for ordering the connecting wires (34, 35) of the device (2) to be secured to the mounting strip (3). Ordering assembly (8) has a plurality of ordering segments (7, 9, 11) along the longitudinal direction of the mounting strip (3). The ordering segments are interconnected or rest against one another. One or more ordering segments (7, 9, 11) can be selectively detached from the ordering assembly (8) and can be removed from ordering assembly (8) to leave a gap (8) or be replaced by another ordering segment (7, 9, 11).

17 Claims, 11 Drawing Sheets

(72) Inventors: Jürgen Lang, Ludwigsburg (DE);
Hubert Erker, Gingen (DE); Virgil Ghizelea, Stuttgart (DE)

(51) Int. Cl.
*H02B 1/052* (2006.01)
*H02B 1/20* (2006.01)

(58) Field of Classification Search
USPC .................. 174/97, 95; 361/640, 637, 627
See application file for complete search history.

(56) References Cited

U.S. PATENT DOCUMENTS

| | | | | |
|---|---|---|---|---|
| 3,225,264 A | * | 12/1965 | Weiss | H02B 1/20 174/138 F |
| 3,366,846 A | * | 1/1968 | Brumfield | H02B 1/20 361/622 |
| 3,547,274 A | * | 12/1970 | Sosinkski | H01R 13/518 211/26 |
| 4,472,761 A | * | 9/1984 | Koslosky | H02B 1/21 361/638 |
| 5,144,530 A | * | 9/1992 | Cohen | H02B 1/21 174/99 B |
| 5,166,861 A | * | 11/1992 | Krom | H02B 1/056 174/16.2 |
| 5,669,788 A | * | 9/1997 | Brockman | H01R 9/2675 439/511 |
| 6,018,455 A | * | 1/2000 | Wilkie, II | H02B 1/21 165/80.3 |
| 6,160,699 A | * | 12/2000 | Gibson | H02B 1/21 361/643 |
| 2008/0030930 A1 | * | 2/2008 | Adunka | H01H 9/342 361/611 |
| 2009/0185336 A1 | * | 7/2009 | Karim | H02B 1/052 361/652 |
| 2011/0086531 A1 | * | 4/2011 | Brutsch | H02B 1/205 439/212 |
| 2011/0164393 A1 | * | 7/2011 | Wang | H02B 1/052 361/809 |

FOREIGN PATENT DOCUMENTS

| | | | | |
|---|---|---|---|---|
| DE | 43 23 370 A1 | 1/1995 | | |
| DE | 203 01 265 U1 | 6/2004 | | |
| DE | 10 2008 060 843 B3 | 4/2010 | | |
| EP | 1376793 | * | 1/2004 | ............ H02B 1/052 |
| EP | 1 465 307 A2 | 10/2004 | | |

* cited by examiner

MOUNTING SYSTEM FOR ARRANGING ELECTRIC DEVICES, FOR EXAMPLE, ESPECIALLY IN SWITCHGEAR CABINETS

FIELD OF THE INVENTION

The invention relates to a mounting system for arranging electric devices, especially in electrical enclosures and switchgear cabinets.

BACKGROUND OF THE INVENTION

In industrial control technology, electric devices are often disposed in electrical enclosures or switch boxes. The individual devices are disposed on support rails, for example, a top-hat rail, and can be lined up next to one another. The devices are subsequently wired, wherein a comb-shaped ordering assembly is secured to the mounting strip comprising the support rail. The ordering assembly orders the connecting wires of the devices. An associated mounting system is offered by the applicant, Friedrich Lütze GmbH in 71384 Weinstadt, Germany, and is also disclosed in DE 203 01 265 U1, for example.

DE 43 23 370 A1 discloses a profiled strip made of insulating material for holding a large number of electrical cables.

DE 10 2008 060 843 B3 discloses deflection modules for cables, which can be screwed onto a vertical frame leg of a frame structure of an electrical enclosure.

SUMMARY OF THE INVENTION

The problem addressed by the present invention involves providing a new mounting system having improved basic performance and, in particular, being able to be used in a versatile manner and being easy to handle and install. In one embodiment, an object is to improve the ordering of the connecting wires and to improve flexibility.

The problem is basically solved by the mounting system, according to one embodiment, where the mounting system comprises at least one preferably horizontal mounting strip to which at least one or more devices can be secured. The mounting system furthermore comprises an ordering assembly, which can be connected to the mounting strip and used for ordering the connecting wires of the device that is to be secured to the mounting strip. The mounting strip can be formed by a profile, for example, and can be made of aluminum or an aluminum-containing alloy, in particular. The mounting strip can comprise an integral receiving device for the ordering assembly to be secured thereto. The ordering assembly can be made of an electrically insulating material, in particular a plastic.

The ordering assembly has a plurality of ordering segments along the longitudinal direction of the mounting strip that are interconnected or rest against one another in an initial state of the mounting strip, and preferably are identically designed and/or of equal length. One or more ordering segments can be selectively detached from the ordering assembly, easily, preferably manually and, optionally, with the use of a tool, and be subsequently removed from the ordering assembly. The removal leaves a gap in the ordering assembly for being replaced by another ordering segment, which preferably has the same length, thereby closing the gap.

In this connection, advantageously, when at least a portion of the individual ordering segments of the mounting system, in particular the ordering segments that are provided or released for replacement, do not exceed a specifiable maximum length of, for example, less than 150 mm, in particular less than 100 mm, and preferably less than 80 mm, relatively easy detachment and replacement from the group of ordering segments disposed on the mounting strip, in particular, manually or with a simple tool, is permitted. A minimal use of force, and preferably without the need to detach or remove the adjacent ordering segment from the defined position thereof on the mounting strip is also permitted.

In addition, different ordering segments can be inserted, for example for different dimensions of the connecting wires to be ordered, in a selective manner at the suitable location. This ability can even take place, in particular, on-site at the installation point of the mounting system, for example after the position of the device to be secured, with the specific connecting wires thereof, has been selected. In terms of preparing for installation, advantageously, in the initial state the ordering segments are interconnected. The ordering assembly can then be easily inserted into a relatively large section or, preferably, into the entire length of the mounting strip.

In the mounting system, one or more mounting strips can be fastened to a support device, for example, to profiled rods extending at right angles to the mounting strips and preferably vertically. The profiled rods, together with the mounting strips, can form a mounting frame, which can be pre-assembled and subsequently inserted into an electrical enclosure, for example, at the installation site.

The ordering segment can be designed in the shape of a comb having ordering elements, which protrude from a strip-shaped. In particular, a straight fastening section extends diagonally or transversely relative to the longitudinal direction of the ordering segment, which can coincide with the longitudinal direction of the mounting strip. Between the ordering elements, connecting wires can be inserted and thereby be fixed in at least one direction.

In one embodiment, the ordering elements comprise interlinking structures or parts at both axial ends thereof. By the interlinking structures, an ordering segment can be linked to another ordering segment adjacent thereto in the longitudinal direction. For example, each ordering segment can include a cylinder integrally disposed at a first axial end thereof. The cylinder extends at a right angle to the longitudinal axis and, in particular, is round or polygonal. At the opposing, second axial end of the ordering segment, the ordering segment can include a correspondingly formed cylindrical receptacle, into which the first axial end of the adjacent ordering segment can be inserted.

In the interlinked state, the fastening sections of the ordering segments are aligned with one another to thereby ensure easy insertion into the receiving device of the mounting strip. In one embodiment, the cylinder axis of the linking elements is parallel to the insertion direction of the ordering segments into the receiving device of the mounting strip such that the ordering segments can also be detached and removed easily and, preferably, without the use of tools, in the state in which the ordering assembly is fixed on the mounting strip. If necessary, another ordering segment, which has a different shape, in particular, can be inserted into the gap that forms.

In one embodiment, the interlinking of the ordering segments can be released, in particular, by a relative motion of the two interlinked ordering segments diagonally and, in particular, transversely to the longitudinal direction of the ordering segments. The relative motion for detachment can also extend parallel to the insertion direction of the ordering segment into the receiving device of the mounting strip.

In one embodiment, the ordering assembly in an initial state is formed, as a single piece, by the ordering segments lined up next to one another. The ordering assembly has predetermined separation points, which are preferably equidistant and delimit the individual ordering segments. These predetermined separation points can be separated either without the use of tools or with the use of a simple tool, for example, a cutting blade. The separated ordering segment or a group of separated ordering segments can be subsequently removed.

In one embodiment, the predetermined separation points are disposed in a fastening section of the ordering assembly. The ordering assembly can then be fastened on the mounting strip. The predetermined separation points can be disposed, preferably, between two adjacent ordering elements, thereby enabling adjacent ordering segments to be separated with low forces, in particular, without the need to sever any of the ordering elements.

In one embodiment, the ordering segments have a tool engagement surface, preferably in the center relative to the longitudinal extension thereof, on which a tool can be placed to detach an ordering segment connected to the mounting strip. The recess is preferably located in the fastening section of the ordering segments, in particular, close to the transition of the fastening section to the ordering elements of the ordering segment. For example, the tool engagement surface can be formed by a groove in the fastening section. The groove extends diagonally and, in particular, transversely to the longitudinal direction of the ordering segment. One end of the groove is accessible for the tool, for example, a flat-blade screwdriver, even in the state in which the ordering segment is connected to the mounting strip.

In one embodiment, the mounting system comprises a plurality of ordering segments, which differ with regard to the ordering elements, but which are identical with regard to its fastening section used for attachment to the mounting strip, and optionally with regard to the interlinking structures or predetermined separation points thereof. For example, one of the ordering segments forms a receiving channel for the connecting wire to be ordered. The receiving channel preferably extends across the entire length of the ordering segment. A leg of the ordering segment disposed opposite the mounting strip or the fastening section of the ordering segment can be deflected, thereby allowing the connecting wire to be ordered to be inserted into the receiving channel. In this manner, particularly large or a plurality of relatively small connecting wires, for example, pneumatic or fiber optic connecting lines as well, can be ordered using this ordering segment.

In one embodiment, the mounting system comprises an ordering segment having a holding section, which protrudes diagonally and, in particular, transversely to the longitudinal direction, for attaching a holder for the connecting line, for example a cable tie. The holding section can also protrude diagonally and, in particular, transversely to the ordering elements of the ordering segment, for example in the direction of a front side of the mounting strip, on which the support rail is disposed such that the holding section of the ordering segment is accessible from the front side of the mounting strip.

In one embodiment, at least one portion of the ordering segments, preferably all ordering segments, have an equal length of less than 150 mm, in particular less than 100 mm, and preferably less than 80 mm. In addition, the mounting system can also comprise ordering segments having a length of, for example, 150 mm or 300 mm, in particular, ordering segments that are not intended to be detached from the mounting strip from the group of ordering segments secured there. The length of the individual ordering segments can be adapted to the length of the mounting strips that are used, such that a whole-number multiple of the length of the ordering segments yields the length of the mounting strip. In one embodiment, an equal length of the ordering segments of 50 mm, in particular, is particularly advantageous, because this allows the usual lengths of the mounting strips to be combined without the loss of space or without the need to manually trim the ordering segments.

The mounting system can also comprise ordering segments that have a multiple of the length of a basic ordering segment, for example ordering segments having a length of 100 mm, 150 mm or 300 mm compared to a basic ordering segment having a length of 50 mm.

The devices that can be fastened on the mounting strip can be, for example, electric devices, such as power supply devices, fuses, controllers, input/output assemblies, interface units, temperature converters, analog/digital converters, or the like. As an alternative or in addition thereto, the device can also comprise non-electric components, for example optical components or pneumatic components.

Further advantages, features, and details of the plurality of exemplary embodiments described in detail with reference to the drawings can be essential to the invention individually or in any combination.

Other objects, advantages and salient features of the present invention will become apparent from the following detailed description, which, taken in conjunction with the annexed drawings, discloses preferred embodiments of the present invention.

BRIEF DESCRIPTION OF THE DRAWINGS

Referring to the drawings that form a part of this disclosure.

DETAILED DESCRIPTION OF THE INVENTION

Figure 1:
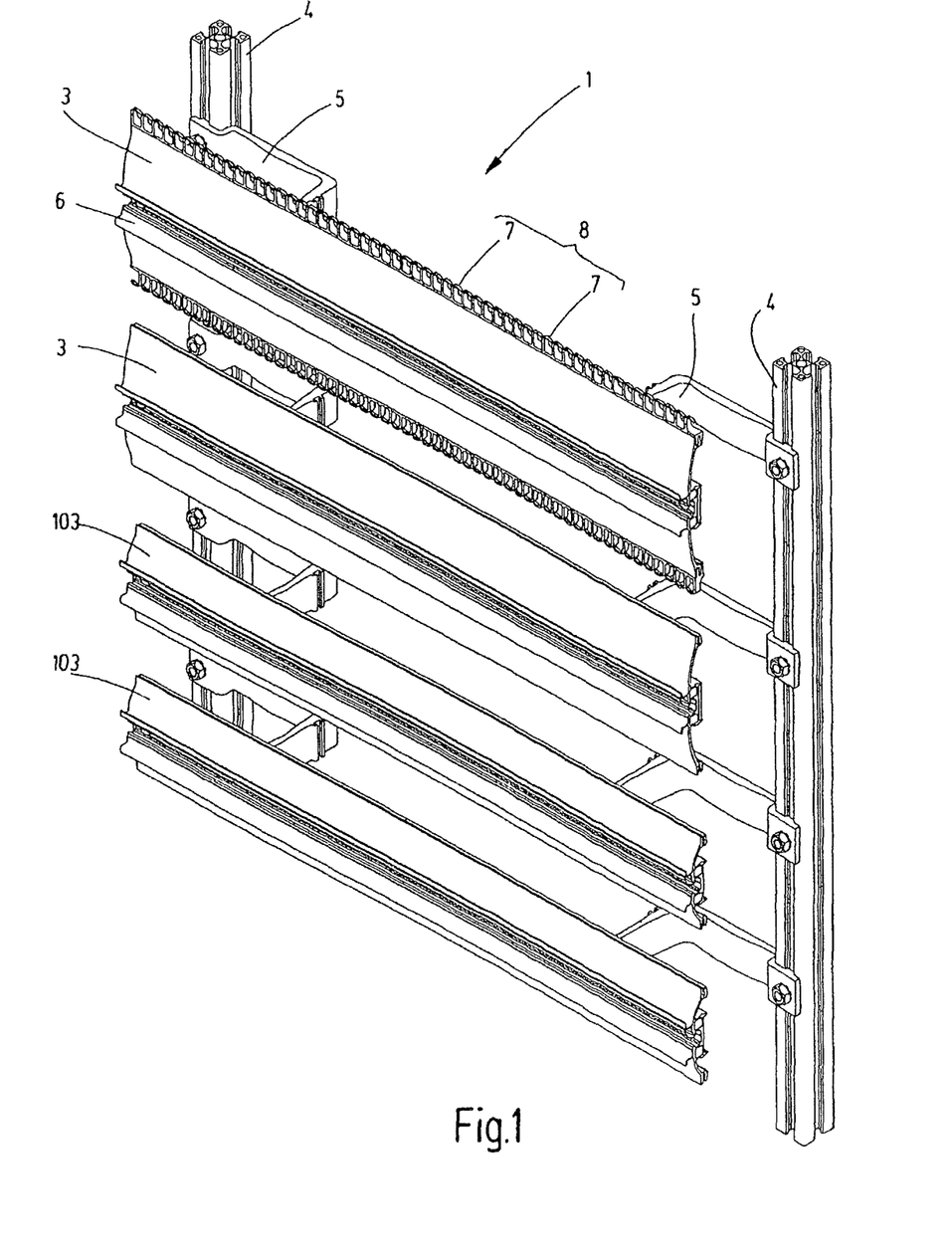
FIG. 1 is a perspective view of a mounting system according to an exemplary embodiment of the invention.

FIG. 1 shows a perspective view of an exemplary embodiment of a mounting system 1 comprising a total of four horizontal mounting strips 3, 103, to each of which at least one device 2 (FIG. 17) can be secured. The two lower mounting strips 103 have a lesser lateral extension compared to the two upper mounting strips 3. The mounting strips 3, 103 are each connected to a vertical profiled rod 4 at or close to the two ends of the mounting strips, for example up to 200 mm and, in particular, up to 125 mm from the two ends of the mounting strips. A mounting bracket 5 or any other type of connecting element 79 (FIG. 31) connects the mounting strip ends, in each case, to a vertical profiled rod 4. The mounting strips, together with the profiled rods 4, form a mounting frame, which mounting frame can be pre-assembled and subsequently inserted into an electrical enclosure in the state illustrated in FIG. 1, or with devices 2 and the connecting wires 34, 35 (FIG. 5) thereof already secured thereto. The mounting strips 3, 103 each comprise a support rail 6, to which the devices 2 are to be secured. In the exemplary embodiment, the support rail is a top-hat rail that is standardized or substantially corresponds to a standard and has a height of 7.5 mm.

An ordering assembly 8 is secured to each of the longitudinal edges of the upper mounting strip 3 in FIG. 1. The ordering assembly is composed of a plurality of identically designed ordering segments 7. One or more ordering segments 7 can be selectively detached from the ordering assembly 8 and be removed from the ordering assembly 8 or the mounting strip 3 to leave a gap therein, or be replaced by another ordering segment 9 (FIG. 2), 11, (FIG. 3), or a group of other ordering segments 9, 11.

Figure 2:
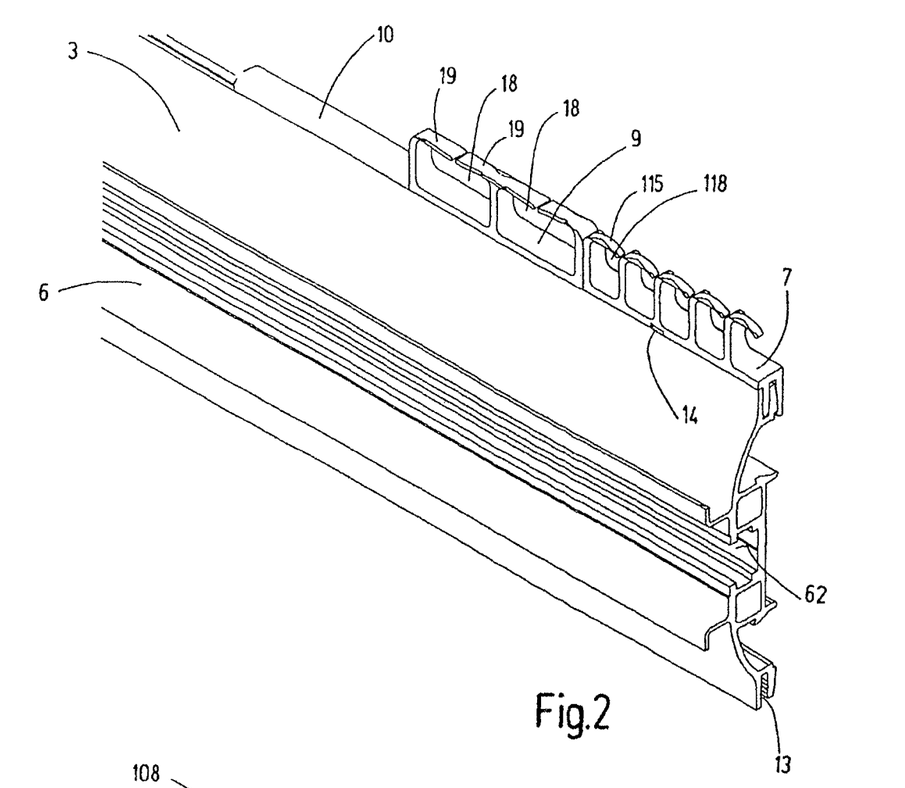
FIG. 2 is an enlarged, partial perspective view of the mounting strip of FIG. 1.
Figure 3:
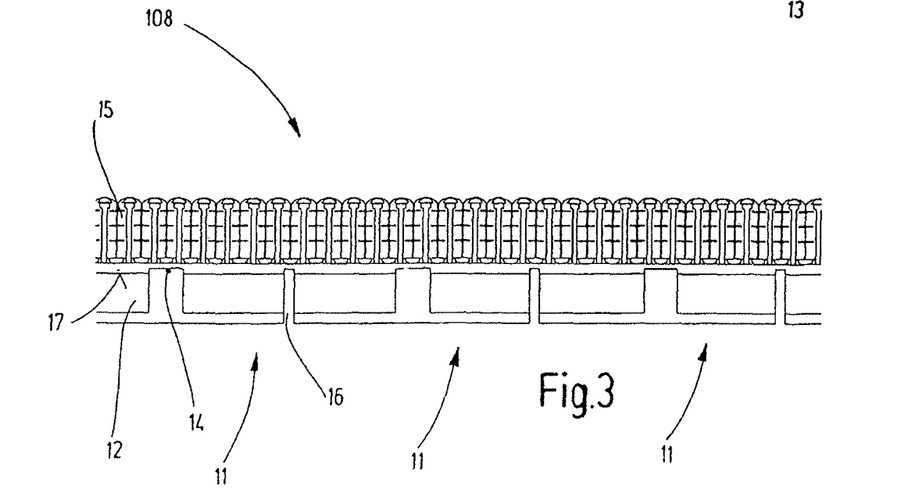
FIG. 3 is a front view of an ordering assembly according to an exemplary embodiment of the invention.

FIG. 2 shows an enlarged representation of a mounting strip 3. FIG. 3 shows an ordering assembly 108 composed of a plurality of ordering segments 11. Each ordering segment is formed as one piece. The ordering segments are disposed one behind the other. Instead of the one-piece design, the ordering segments 11 can be interlinked at the ends thereof, by which the ordering segments 11 can be detachably interlinked. The ordering assembly 108 can be produced in specifiable lengths of approximately 1 m or 2 m, for example, or in a continuous form.

Figure 7:
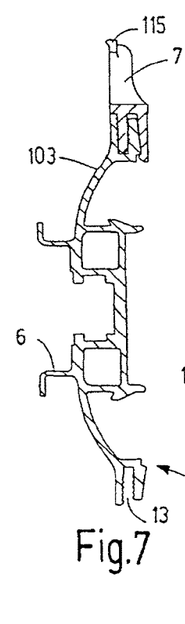
FIG. 7 is a side view in section through a mounting strip having the ordering segment from FIG. 6 fastened thereon.

Each ordering segment 11 comprises a peg-shaped fastening section 12 that can be inserted into a receiving device 20 disposed on the longitudinal edges of the mounting strip 3, and comprises a groove 13 (FIG. 7). A groove 14 extending in the insertion direction is formed in the fastening section 12 in the center relative to the longitudinal extension. One end that groove 14 forms a tool engagement surface and remains accessible in the inserted state and into which a tool 33 (FIG. 4) can be inserted for detaching the ordering segment 11.

The ordering segment 11, designed as one piece with the fastening section 12, preferably comprises elastically deflectable ordering elements 15. Between the ordering elements connecting wires 34, 35 of the device 2 can be inserted and thereby fixed in an ordered manner. Predetermined separation points 16, at which the ordering segments 11 can be separated, are formed by indentations in the fastening section 12. The indentations extend past a stop edge 17 formed by the ordering segment 11. Up to the stop edge, the ordering segment 11 can be inserted into the groove 13. As a result, the position of the predetermined separation point 16 is also visible in the inserted state. A separating cut can take place from the direction of the ordering elements 15.

The ordering segment 9 comprises two receiving channels 18, each of which extends across half the length of the ordering segment 9, for the connecting wires 34, 35 to be ordered. Two legs 19 of the ordering segment 9, which legs are disposed opposite the mounting strip 3 or the fastening section 12, can be elastically deflected so that the connecting wires 34, 35 to be ordered can be inserted into the receiving channel 18. In contrast, the ordering segment 7 comprises a plurality of ordering elements 115, specifically five thereof in the exemplary embodiment, each of which has an elastically deformable hook section for closing the receiving channel 118. Additional ordering segments can also include differently designed receiving channels 18, 118, in particular differently sized receiving channels 18, 118, for example one or more larger receiving channels 18 in a manner identical or similar to the ordering segment 9, and one or more smaller receiving channels 118 in a manner identical or similar to the ordering segment 7. In one embodiment, the longitudinal extension of the individual receiving channels 18, 118 is at least 5%, in particular at least 8%, and preferably at least 10% of the entire longitudinal extension of the ordering segment 7, 9. The additional component 10 of the mounting system 1 is an edge protection element. The ordering segments 7, 9, as well as the additional component 10, have an equal length of 50 mm in the exemplary embodiment.

Figure 4:
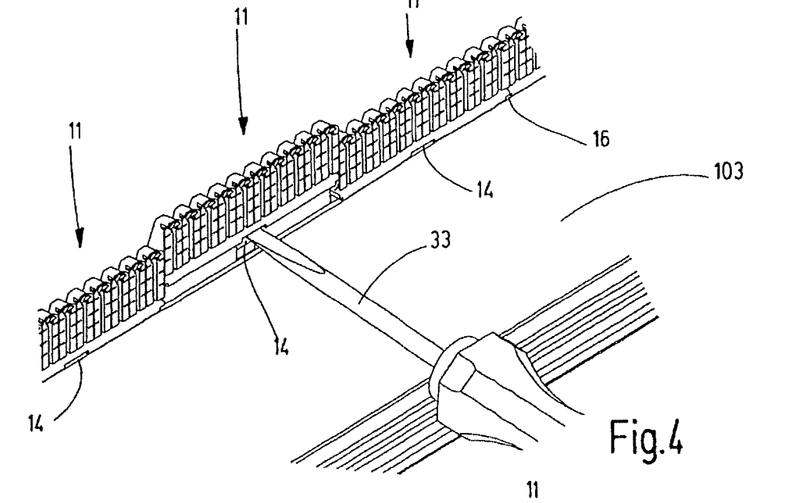
FIG. 4 is a perspective view of a mounting strip having an inserted ordering assembly.

FIG. 4 shows a perspective view of a mounting strip 103 having an ordering assembly 108, which is formed by a succession of ordering segments 11 and which is inserted into the groove 13. One ordering segment 11 was separated by two incisions at the predetermined separation points 16. By inserting a tool 33, for example the blade of a flat-blade screwdriver, the separated ordering segment 11 can be detached and removed from the mounting strip 103.

Figure 5:
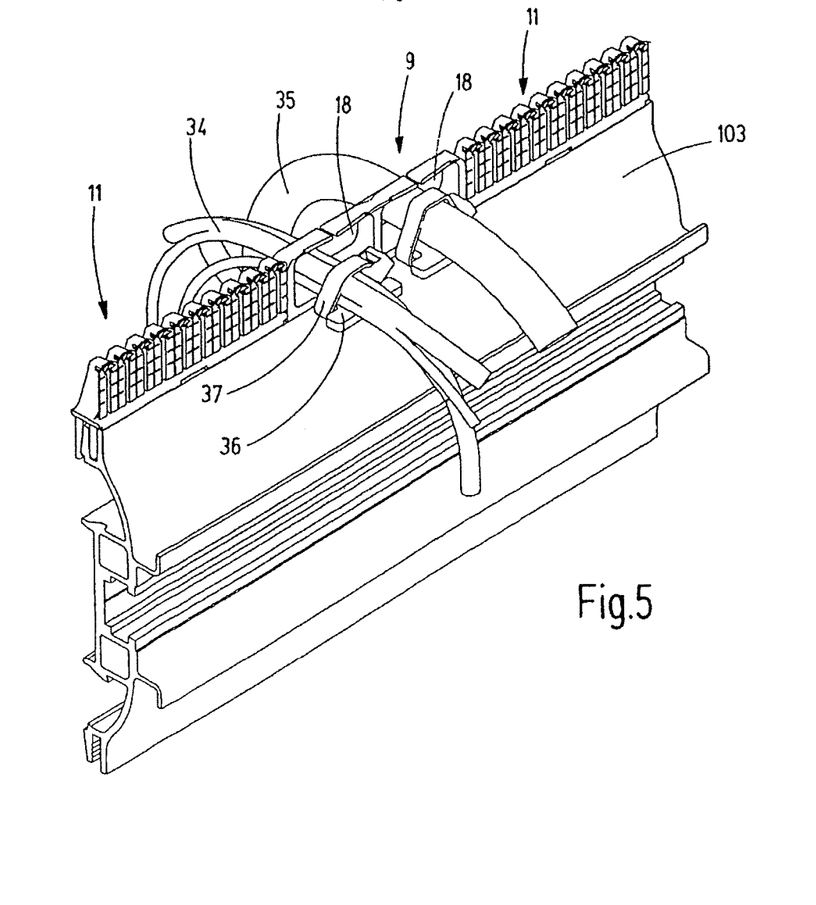
FIG. 5 is a perspective view of the mounting strip from FIG. 4 having a replaced ordering segment.

FIG. 5 shows a perspective view of the mounting strip 103 from FIG. 4, wherein, instead of the ordering segment 11 that was detached in FIG. 4, an ordering segment 9 having two large receiving channels 18 is inserted. A bundle of connecting wires 34 or a connecting wire 35 having a large cross-section is inserted into the receiving channels.

In order to improve the fixation of the connecting wires 34, 35, the ordering segment 9 has a holding section 36, which protrudes transversely to the longitudinal direction, in particular, protruding on the front side of the mounting strip 103 with the support rail 6. The ordering segment 9 includes one holding section 36 for each receiving channel 18. The holding section 36 is T-shaped on the free end thereof for the improved fixation of a holder 37 that can be a cable tie.

Figure 6:
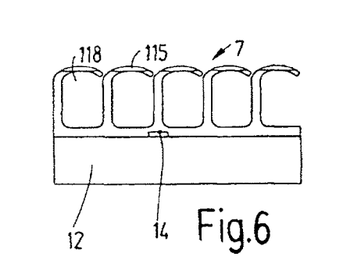
FIG. 6 is a front view of an additional ordering segment.
Figure 9:
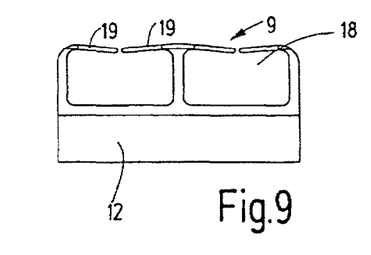
FIG. 9 is a side view of another ordering segment.
Figure 12:
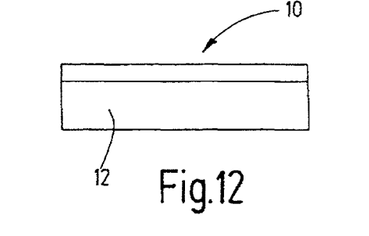
FIG. 12 is a front view of an additional component for the mounting system.

FIGS. 6, 9, and 12 are depictions of the ordering segments 7, 9 and the additional component 10. The ordering segment 9 and the additional component 10 can be non-detachably fixed to the mounting strip 3, which is why these components 9, 10 do not have a tool engagement surface 14.

Figure 8:
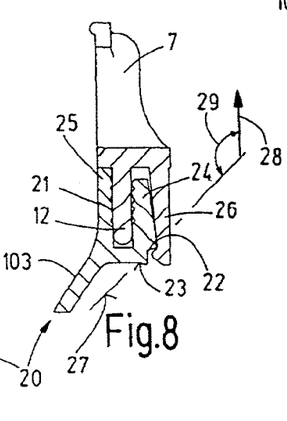
FIG. 8 is an enlarged partial side view in section of a portion of the mounting strip and ordering section of FIG. 7.

FIG. 7 shows a section through a mounting strip 103 having an ordering segment 7 secured thereto. FIG. 8 shows, in an enlarged view, a cutout of FIG. 7 in the region of the connection of the ordering segment 7 to the mounting strip 103. The receiving device 20 extends along the longitudinal axis of the mounting strip 103 and is integrally formed with the mounting strip 103. The ordering segment 7 can be inserted into the receiving device that comprises the groove 13. The side walls of groove 13 have a plurality of additional grooves 21 or flutings extending in the longitudinal direction of the mounting strip 103, as well as two latching flanks 22, 23 on the outer side of the receiving device 20. The latching flanks 22, 23 extend in the longitudinal direction of the mounting strip 103 and are integrally formed therewith. In particular, the latching flanks 22, 23 are formed on an outer side of a wall 24, which borders the groove 13. This wall is offset in the lateral direction relative to the opposing wall 25, which also borders the groove 13. The wall 24 has a surface on the outer side extending diagonally relative to the insertion direction of the ordering segment 7 and, in particular, diagonally relative to the groove 13. Due to the diagonal position, the latch 26 can deflect when the ordering segment 7 is inserted with a low insertion force.

The ordering segment 7, which is a component of the first type of the mounting system 1, comprises an associated latch 26 formed by a leg. In the non-deformed initial state, the leg extends virtually parallel to the fastening section 12, but can be elastically deflected relative thereto. A latching flank 27 of the first type is formed close to the free end of the leg. The latching flank, together with the direction 28 of the pulsing force, encloses an angle 29 of more than 90°. As a result, the interlocking can be released solely with pulling force. To simplify handling, the release force can be applied by a flat-head screwdriver 33, which can be inserted into the tool engagement surface 14.

Figures 10, 11:
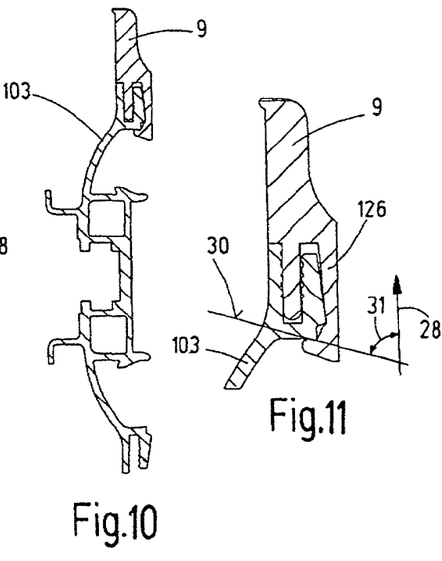
FIG. 10 is a side view in section through a mounting strip having the ordering segment of FIG. 9 fastened thereon.
FIG. 11 is an enlarged, partial side view in section of a portion of the mounting strip and ordering section of FIG. 10.

FIG. 10 shows a section through a mounting strip 103 having an ordering segment 9 secured thereto. FIG. 11 shows and enlarged representation of a portion of FIG. 10 in the region of the connection of the ordering segment 9 to the mounting strip 103. The ordering element 9 is a component of the second type of the mounting system 1 having an associated latch 126 having a latching flank 30 of the second type. Latching flank 30, together with the direction 28 of the pulling force, encloses an angle of less than 90°. As a result, the interlocking cannot be released solely with pulling force, but rather is self-locking. The ordering element 9 is therefore very securely fastened on the mounting strip 3, as necessary for the large receiving channels 18 for accommodating large and heavy connecting wires 34, 35.

Figures 13, 14:
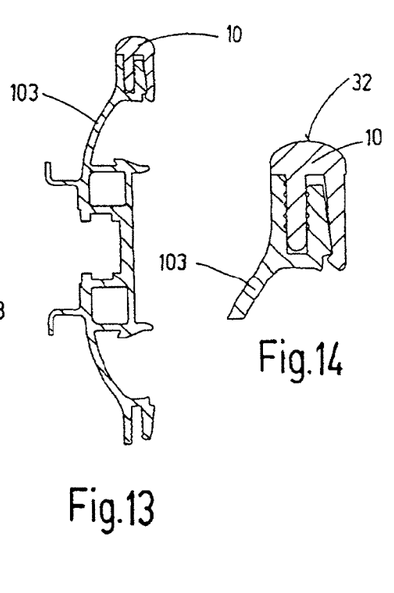
FIG. 13 is a side view in section through a mounting strip having the additional component of FIG. 12 fastened thereon.
FIG. 14 is an enlarged, partial side view in section of a portion of the mounting strip and additional component of FIG. 13.

FIG. 13 shows a section through a mounting strip 103 having an additional component 10 secured thereto. FIG. 14 shows an enlarged view of a portion of FIG. 13, in the region of the connection of the additional component 10 to the mounting strip 103. The additional component 10 is an edge protection element having a convex, non-circular surface 32 extending across an angular range of 180° on the surface thereof facing away from the mounting strip 103. The additional component 10 can be produced, for example, as an extrusion part made of a plastic and can be trimmed individually to the desired length. The additional component 10 does not have a tool engagement surface 14. Although possible, in principle, to release the interlocking by a pulling force in the direction 28, this release cannot be carried out manually or requires a large force due to the material that is used and the structural design. This structure is intended to prevent the additional component 10 from being inadvertently detached from the mounting strip 103.

In one embodiment, for each ordering segment 7, 11 or component in which the tool engagement surface 14 is visible when the ordering segment or component is in the state of being secured to the mounting strip 3, 103, the interlocking is not self-locking. The segment or component rather can be released solely with pulling force. In particular, each ordering segment 7, 11 comprises a latching means 26 having a latching flank 27 of the first type, by which the interlocking can be released solely with pulling force.

Figures 15, 16:
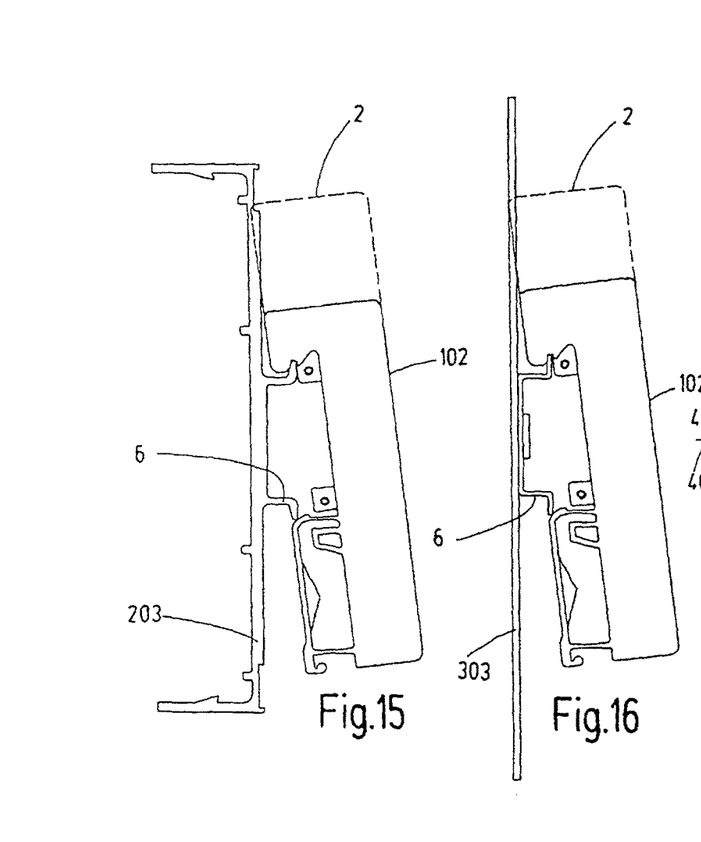
FIG. 15 is a side view of a mounting strip according to the prior art.
FIG. 16 is a side view of a switchboard according to the prior art.

FIGS. 15 and 16 respectively show a side view of a mounting strip 203 according to the prior art and a switchboard 303 according to the prior art, each of which has a support rail 6 having a height of, for example, 7.5 mm. Due to the relatively low height of the support rail 6, devices 2 having a relatively large installation height cannot be secured. At most devices 102 that have a reduced installation height on at least one side can be secured. To solve the problem of being able to secure large devices 2 also in the case of support rails 6 having a relatively low installation height, a mounting strip 3, which is preferably designed to be symmetrical with respect to a center plane 40, has a first preferably middle or center section 41. In middle section 41, the support rail 6 is also formed. A third or end section 43 is spaced apart from the support rail 6 and is at a greater lateral or transverse horizontal distance 44 from the bottom or attachment point 39 of the support rail 6 than a second or intermediate section 42. Second section 42 is disposed between the first section 41 and the third section 43, at the end of the middle section that is close to the support rail 6, in particular at the end thereof adjoining the support rail 6.

Figure 17:
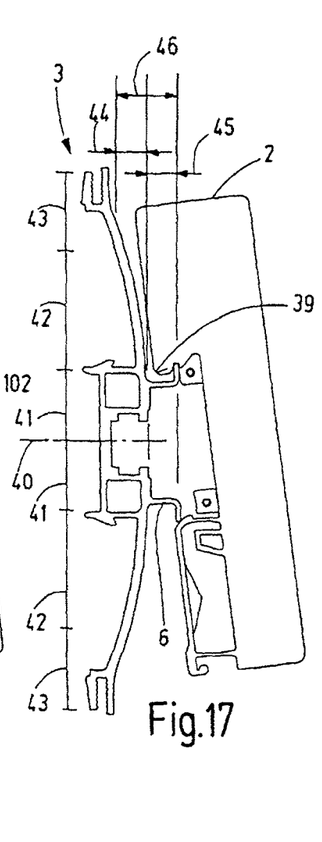
FIG. 17 is a side view of a mounting strip according to an exemplary embodiment of the invention during the attachment of a device.
Figure 18:
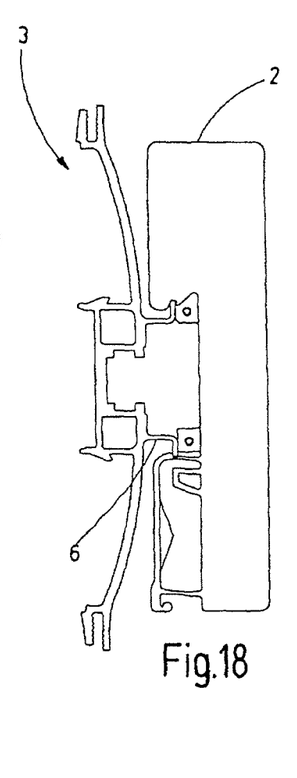
FIG. 18 is a side view of a mounting strip according to an exemplary embodiment of the invention having a device secured thereto.

In the exemplary embodiment of FIGS. 17 and 18, this attachment of device 2 is achieved by a convex curvature of the mounting strip 3, in particular, in the second section 42 thereof. The convex curvature extends across an angular range of approximately 15°. The radius of the convex curvature is approximately four times the lateral extension of the curved second section 42. The distance 44 between an end of the second section 42 that faces the third section 43 and an end of the second section 42 that faces the first section 41 corresponds approximately to the width or lateral extension 45 of the support rail 6. The overall width or extension 46 for securing the device 2 to the support rail 6 is then approximately twice the width or lateral extension 45 of the support rail 6. As shown in FIGS. 17 and 18, devices 2 having a large design can be easily secured to the mounting strip 3 despite the relatively low height 45 of the support rail 6.

Figure 19:
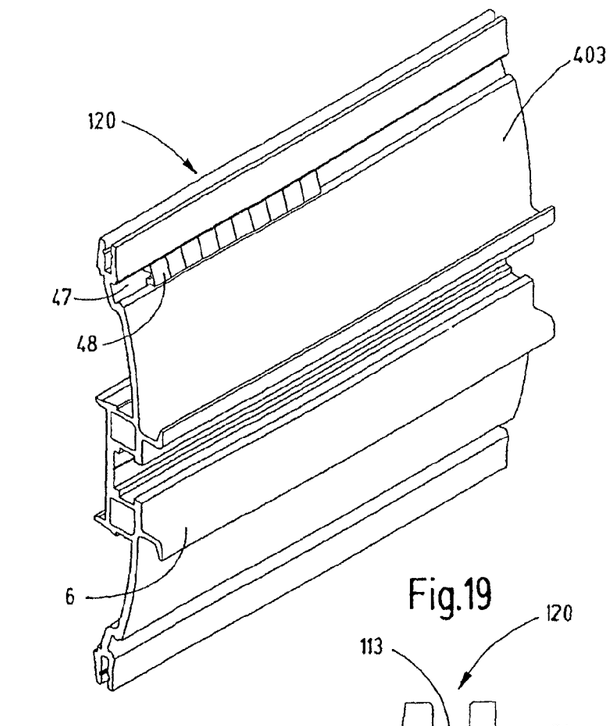
FIG. 19 is a perspective view of a mounting strip according to another exemplary embodiment of the invention.
Figure 20:
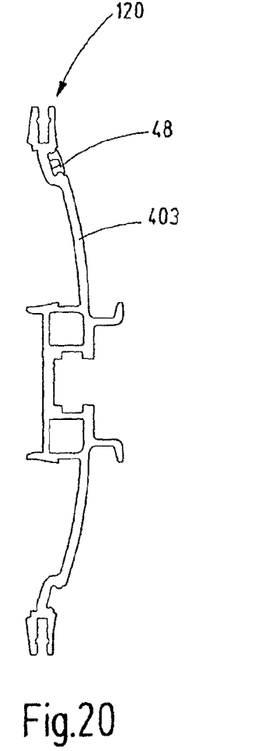
FIG. 20 is a side view of the mounting strip of FIG. 19.
Figure 21:
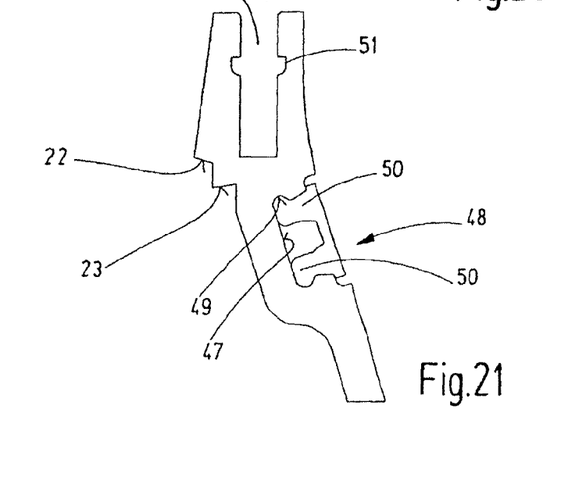
FIG. 21 is an enlarged, partial side view of a portion of the mounting strip of FIG. 20.

FIG. 19 shows a perspective view of a mounting strip 403. FIG. 20 shows a side view of the mounting strip 403 of FIG. 19. FIG. 21 shows an enlarged representation of a portion of FIG. 20 in the region of a groove 47, which is integrally formed with the mounting strip 403, for the releasably snap-in insertion of identification labels 48. The groove 47 has an undercut 49 on both sides, into each of which an elastically deflectable leg 50 of the identification label 48 engages in a latching manner. The groove 47 is disposed in the region of the third section 43 of the mounting strip 403 or in an end of the second section 42 of the mounting strip 403 that is remote from the first section 41. The identification label 48 can then be read even when a device 2 is secured to the mounting strip 403. The identification label 48 can identify, for example, a connecting wire 35, 36 that is routed adjacent to the identification label 48 from the back side to the front side of the mounting strip 403, or a device 2 that is disposed on the support rail in the region of the identification label 48.

Ordering assembly 8 or other components 10 of the mounting system 1 can be inserted into the receiving device 120. In particular, they can be inserted into the engagement groove 113. At least one of the walls that delimits the engagement groove 113 has one or more recesses 51 or flutings that preferably extend in the longitudinal direction of the engagement groove 113, for example for the non-detachable interlocking of a component of the mounting system 1 that can be inserted into the receiving device 120 or plugged into the engagement groove 113. On the outer side, the receiving device 120 also has a first latching flank 22 and a second latching flank 23. The first, non-locking latching flank 22 is situated at a shorter distance from the free end of the receiving device 120 than the locking, second latching flank 23.

Figure 22:
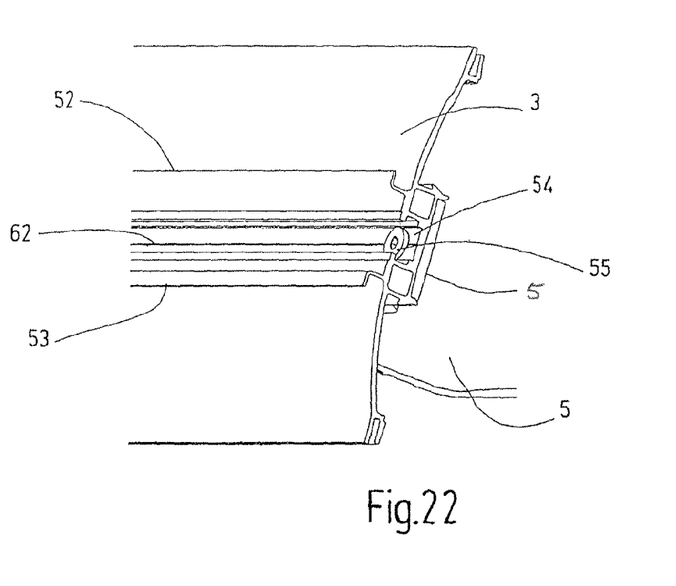
FIG. 22 is a perspective view of one end of the mounting strip of FIG. 1.
Figure 23:
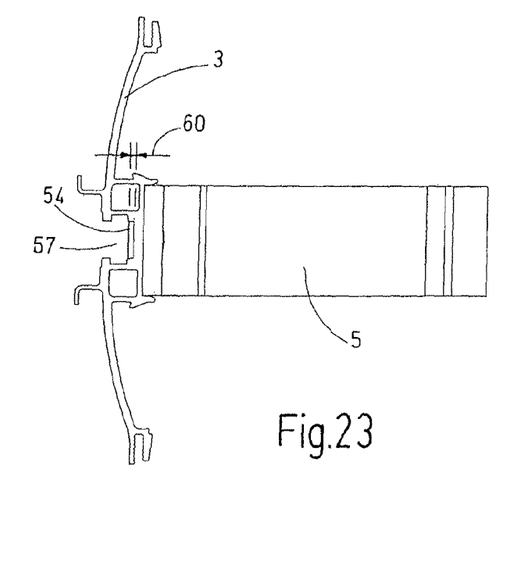
FIG. 23 is a side view of the mounting strip of FIG. 22.
Figure 24:
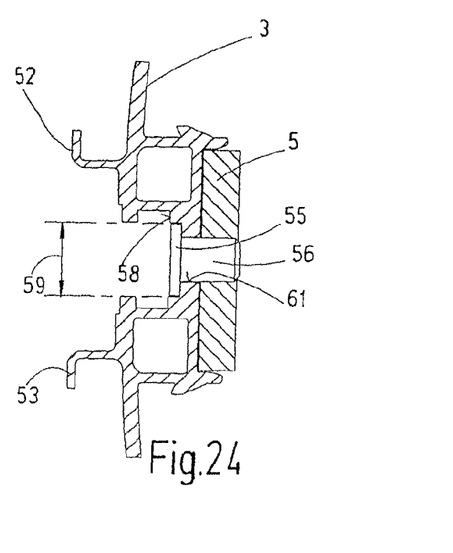
FIG. 24 is an enlarged, partial side view in section of a portion of the mounting strip of FIG. 23.

FIG. 22 shows a perspective view of one end of the mounting strip 3 with the connection to the mounting bracket 5. FIG. 23 shows a side view of the mounting strip 3 of FIG. 22. FIG. 24 shows an enlarged representation of a portion of FIG. 23 in the region of the connection between the mounting strip 3 and the mounting bracket 5. The mounting strip 3 has a groove 54 between the two support legs 52, 53 of the support rail 6. The groove extends in the longitudinal direction of the mounting strip 3 and preferably in the center, and accommodates the head of a flat-head screw, in particular. Thus, in a state in which the mounting strip 3 is connected to the mounting bracket 5, the head 55 does not protrude into the region between the two support legs 52, 53, and therefore, does not obstruct the securing of the device 2.

In the exemplary embodiment, the mounting strip 3 comprises a slide-nut channel 57 between the two support legs 52, 53. The slide-nut channel extends in the longitudinal direction of the mounting strip 3. The groove 54 is formed in the base 58 of the slide-nut channel 57. The head 55 of the connector 56, in the connected state, does not protrude past the base 58 of the slide-nut channel 57 or into the slide-nut channel 57. As a result, even when the connector 56 is installed, one or more slide nuts can be inserted into the slide-nut channel 57, in particular, also into a section of the slide-nut channel 57 that is delimited on both sides by connector 56.

The width 59 of the groove 54 is less than 50% greater than the width of the head 55 of the connector 56, in particular less than 25% and preferably less than 10%. The depth 60 of the groove 54 is less than 50% greater than the height of the head 55 of the connector 56, in particular less than 25%, and preferably less than 10%. The width 59 of the groove 54 is less than 90% of the width of the slide-nut channel 57, in particular less than 80% and, in the exemplary embodiment, is approximately 75%. The width 59 of the groove 54 corresponds approximately to the width of the opening of the slide-nut channel 57 that faces the support legs 52, 53. The depth 60 of the groove 54 is less than 150% of the depth of the slide-nut channel 57, in particular, less than 100% and, preferably, less than 50%.

In the exemplary embodiment, the connector 56 is a flat-head screw, which is inserted into a passage opening 61 in the mounting strip 3, and is screwed into a threaded bore of the mounting bracket 5. The passage opening 61 can be optionally formed at a point in the mounting strip 3 that is suitable for connecting the mounting strip 3 to the mounting bracket 5. To this end, the mounting strip 3 has a slot 62, which functions as a centering aid, is formed in the middle of the base of the groove 54, extends in the longitudinal direction of the mounting strip 3, and is preferably V-shaped.

Figure 25:
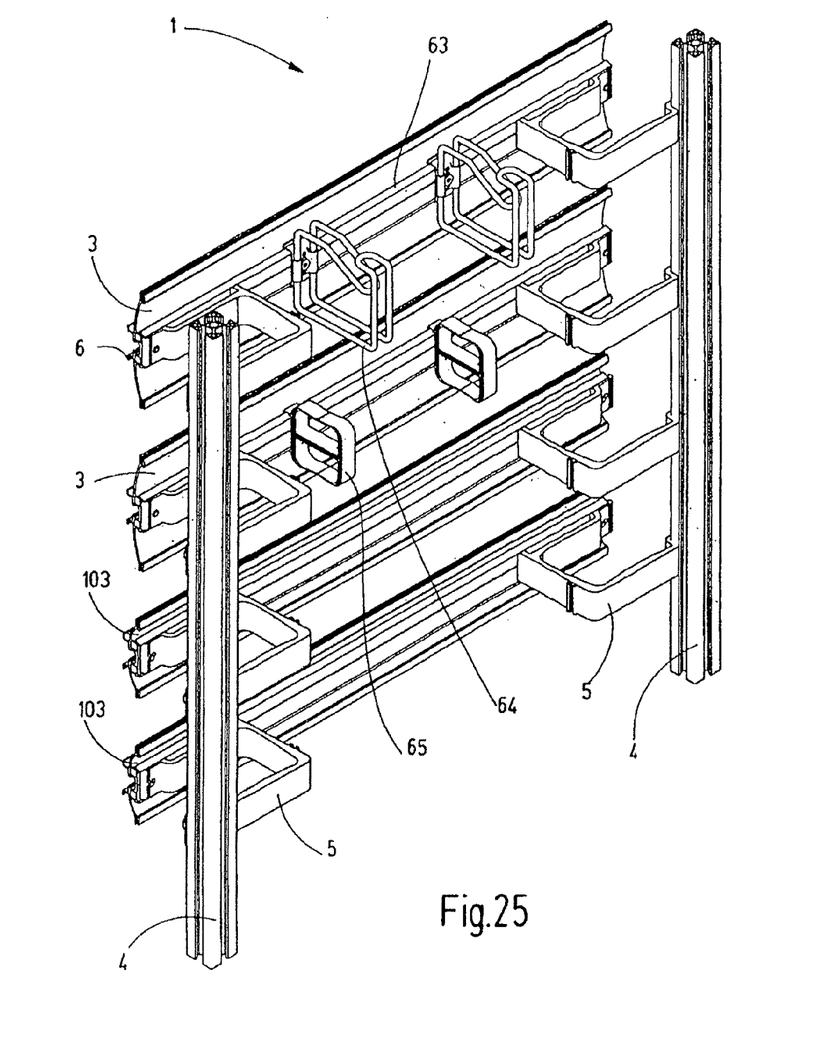
FIG. 25 is a perspective view of the back side of the mounting system of FIG. 1.

FIG. 25 shows a perspective view of the back side of the mounting system 1 from FIG. 1. The mounting strip 3 comprises, on the back side thereof disposed opposite the support rail 6, at least one latching strip 63 extending in the longitudinal direction of the mounting strip 3. Additional components 64, 65 of the mounting system 1 can be latched onto the latching strip directly or be indirectly fastened thereon by an adapter element 66 that can be latched thereto (FIG. 27).

Figure 26:
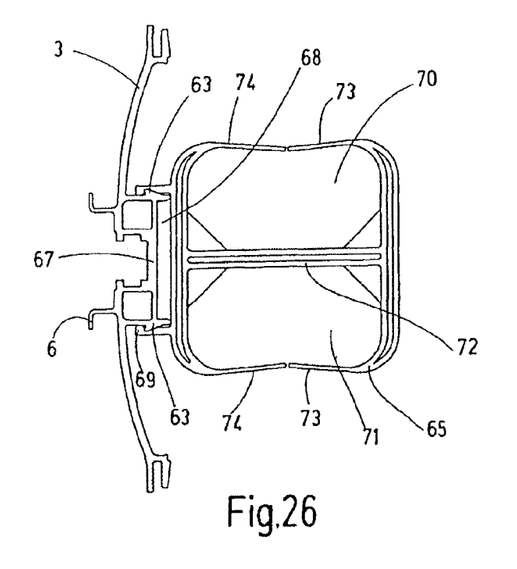
FIG. 26 is a side view of a mounting strip of FIG. 25.

FIG. 26 shows a side view of the mounting strip 3 of FIG. 25. The mounting strip 3 comprises, on the back side and in the middle region thereof, two latching strips 63 extending parallel to one another. The free ends of latching strips 63 overhang relative to a connecting strip 67 and thereby delimit a groove 68 or a receiving channel, into which, for example, either the mounting bracket 5 can be inserted or a connecting element can engage, for example, a connecting element for connecting an additional component 64 to the adapter element 66. The latching strips 63 are integrally formed with the mounting strip 3.

The latching strips 63 comprise a self-locking latching edge 80 (FIG. 32), in particular a latching edge 80 having an undercut 81. The two latching strips 63 extend so as to be spaced apart from one another, but parallel to one another in the region of the support rails 6, which rails are disposed on the front side. A first additional component 65 is snapped onto the latching strips 63 for bundling connecting wires 34, 35 of the device 2 disposed on the front side. The connecting wires extend on the back side of the mounting strip 3. The device 2 has a connection section 69, which can be snapped onto the latching strips 3, as well as two cable guides 70, 71 for accommodating connecting lines 34, 35. The cable guides 70, 71 are symmetrical with respect to a center plane, as is the double-walled partition 72. The two cable guides 70, 71 are each accessible from the outside via two elastically deflectable legs 73, 74. The legs 73, 74 are disposed on opposing sides that adjoin the connecting section 69.

Figure 27:
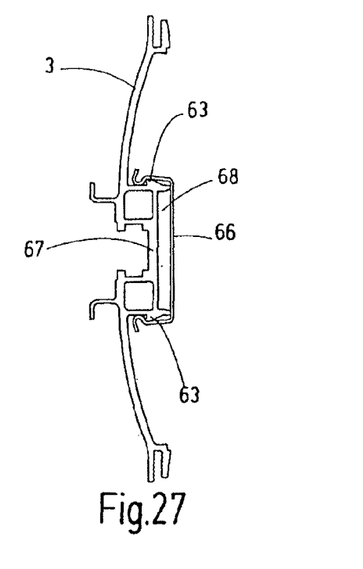
FIG. 27 is a side view of a mounting strip of FIG. 1 having an adapter element that has been snapped onto the latching strips.
Figure 28:
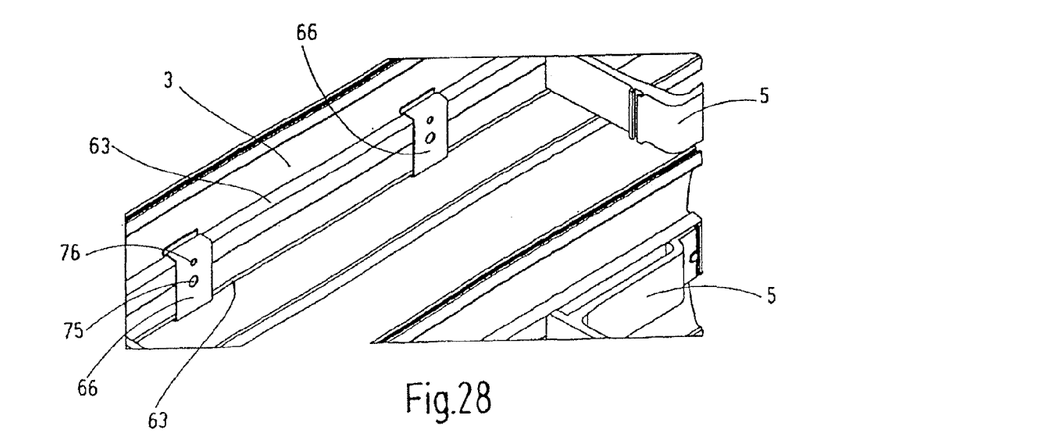
FIG. 28 is a perspective view of the back side of the mounting strip of FIG. 1 having two snapped-on adapter elements.

FIG. 27 shows a side view of a mounting strip 3 comprising an adapter element 66 snapped onto the latching strips 63. FIG. 28 shows a perspective view of the back side of the mounting strip 3 comprising two snapped-on adapter elements 66. The adapter element 66 has a preferably centrally disposed bore 75, which can be designed as a threaded bore or can have a roller-formed thread, an extruded hole, an insert nut, or the like, and one or more preferably eccentrically disposed, additional bores 76, which can form a mechanical interface for securing additional components of the mounting system 1 onto the back side of the mounting strip 3. The additional bore 76 can form, for example, a positioning part for securing additional components, for example, for inserting an associated positioning part of the additional components. The bores 75, 76 correspond to the receiving channel 68, which is limited by the adapter element 66, the two latching strips 63 and the connecting strip 67.

Figure 29:
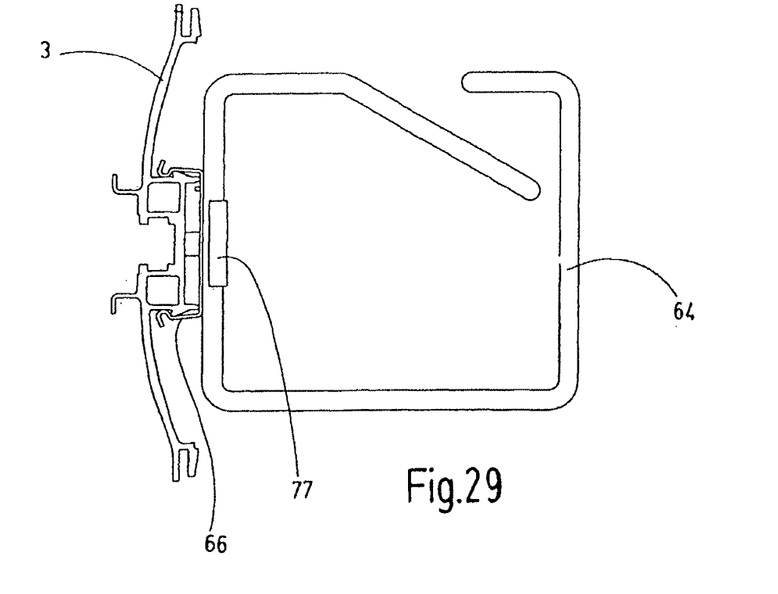
FIG. 29 is a side view of a second additional component of the mounting system according to an exemplary embodiment of the invention.

FIG. 29 shows a second additional component 64 of the mounting system 1, which second additional component is an additional bundling element for bundling supply lines 34, 35. The second additional component 64 is a double-tracked bent wire element secured to the adapter element 66 in a clamped manner by a fastening element 77 screwed together with the adapter element 66. When the fastening element 77 is partially loosened, the second additional component 64 is still held, but can be moved relative to the adapter element 66 along the two wire tracks extending parallel to one another and can be subsequently clamped again such that the desired position of the two additional components 64 can be adjusted relative to the adapter element 66 or the mounting strip 3 fixed on the latching strips 63.

Figure 30:
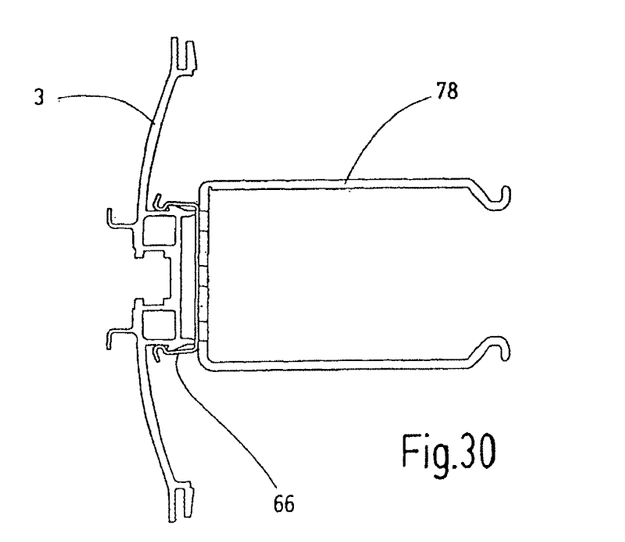
FIG. 30 is a side view of the mounting strip having a cable duct fastened on the back side by adapter elements according to an exemplary embodiment of the invention.

FIG. 30 shows a side view of the mounting strip 3 having a cable duct 78 snapped onto the back side of the mounting strip 3 by the adapter element 66.

Figure 31:
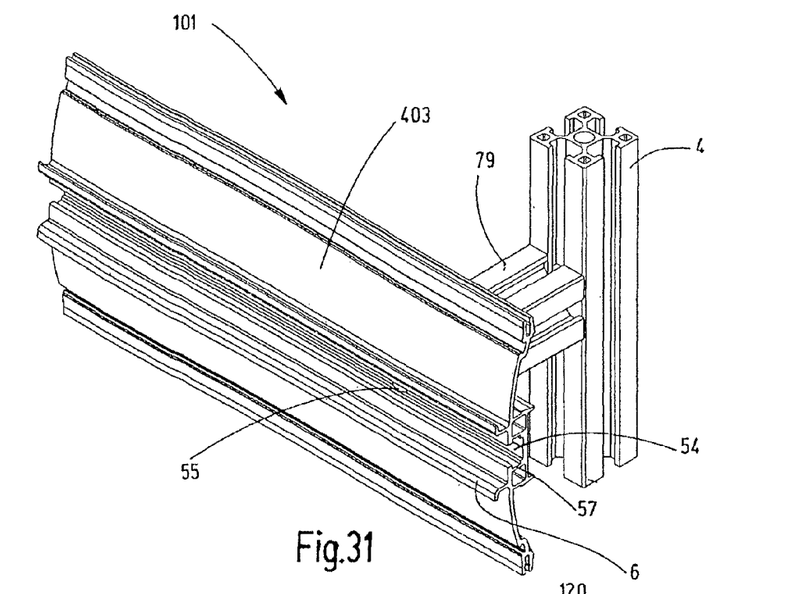
FIG. 31 is a perspective view of a mounting system according to a further exemplary embodiment of the invention.

FIG. 31 shows a perspective view of an additional exemplary embodiment of a mounting system 101, in which at least one mounting strip 403 is connected, at or close to the two ends thereof, to a vertical profiled rod 4 by a connecting element 79 in each case. The connecting element 79 is formed from a section of a profile from which the profiled rod 4 is also produced. As an alternative, any other type of spacer can be used, for example, a profiled piece having smaller cross-sectional dimensions or a rod that has been trimmed to the desired separation of the mounting strip 403 from the profiled rod 4. The head 55 of the screw, connecting the mounting strip 403 connected to the connecting element 79, is disposed so as to be sunken in the groove 54 in the slide-nut channel 57.

Figure 32:
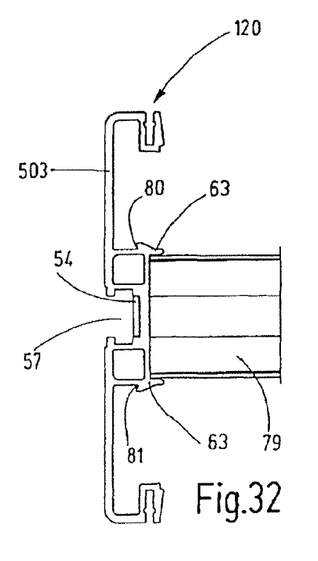
FIG. 32 is a side view of a mounting strip according to another exemplary embodiment of the invention without a support rail.

FIG. 32 shows a side view of a further exemplary embodiment of a mounting strip 503, which can be fastened to a profiled rod 4 by a connecting element 79. The connecting element 79 preferably has a square cross-section and has an edge length that corresponds to or is slightly shorter than the separation between the two latching strips 63. The latching strips 63 then form a guide, by a form closure, when the connecting element 79 is inserted into the receiving channel 68 delimited by the latching strips 63 (FIG. 27). In addition, when any type of spacer other than the connecting element 79 is used, advantageously this spacer also has a form closure with the latching strips 63, for example in the case of a spacer rod having a round cross-section or rounded corners. When this spacer rod has two mutually opposing, flattened sides on the end section thereof facing the mounting strip 503, the separation of which corresponds to the separation of the latching strips 63.

In a manner similar to the above-described exemplary embodiments, the mounting strip 503 comprises a receiving device 120 for ordering assembly 8 or additional components 10 as well as a slide-nut channel 57 having a groove 54. However, the mounting strip 503 does not have a support rail 6. Instead, the devices 2 are secured to the mounting strip 503 by screws, which can be screwed together with nuts that are disposed in the slide-nut channel 57 and can be displaced therein. The sections of the mounting strip 503 adjoining the two sides of the slide-nut channel 57 are planar, for example for placement thereon, over a large area, of the device 2 to be secured. The ends of the planar sections facing away from the slide-nut channel 57 are bent at right angles. Each channel 57 ultimately forms a receiving device 120 offset relative to the plane defined by the planar sections.

Figure 33:
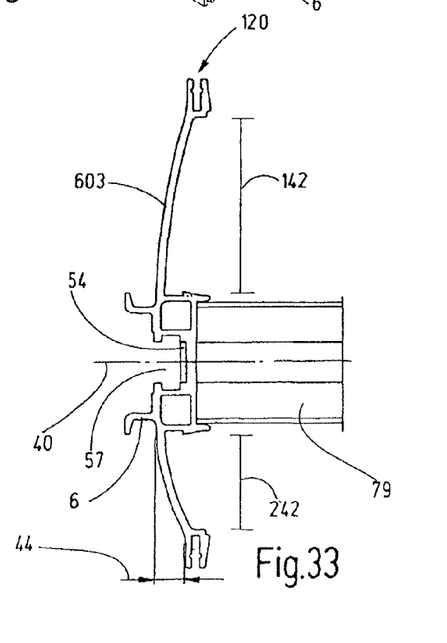
FIG. 33 is a side view of an asymmetrical mounting strip according to yet another exemplary embodiment of the invention.

FIG. 33 shows a side view of a further exemplary embodiment of a mounting strip 603, which can be fastened to a profiled rod 4 by a connecting element 79. The mounting strip 603 has a convex curvature on the front side thereof, wherein a support rail 6 is disposed at the position of the greatest protrusion of said curvature. Whereas the support rail 6 and the slide-nut channel 57 having the groove 54 are symmetrical relative to the center plane 40, the profile of the mounting strip 603 is asymmetrical relative to this center plane 40. The second section 142, which adjoins the support rail 6 on one side and terminates at the receiving device 120, has a greater extension in the lateral direction than the second section 242 adjoining the support rail 6 on the other side. In contrast thereto, the vertical distance 44 between the two sections 142, 242 is the same.

While various embodiments have been chosen to illustrate the invention, it will be understood by those skilled in the art that various changes and modifications can be made therein without departing from the scope of the invention as defined in the claims.

The invention claimed is:

1. A mounting system for arranging electrical devices, comprising:
   at least one horizontal mounting strip secured to at least one electrical device; and
   an ordering assembly connected to said mounting strip ordering connecting lines coupled to said electrical device secured to said mounting strip, said ordering assembly having a plurality of different ordering segments arranged next to one another along a longitudinal direction of said mounting strip, said ordering segments being at least one of interconnected or resting against one another, at least one of the ordering segments being selectively detachable and removable from said ordering assembly to at least one of leave a gap in said ordering assembly or allow replacement with another ordering segment.

2. A mounting system according to claim 1 wherein each said different ordering segment has an equal length in the longitudinal direction of said mounting strip.

3. A mounting system according to claim 1 wherein adjacent ones of said ordering segments are interlinked at adjacent ends thereof in the longitudinal direction of said mounting strip.

4. A mounting system according to claim 3 wherein adjacent ones of said ordering segments are releasably interlined with one another to allow relative motion therebetween diagonally relative to the longitudinal direction of said mounting strip.

5. A mounting system according to claim 3 wherein adjacent ones of said ordering segments are releasably interlinked with one another to allow relative motion therebetween transversely relative to the longitudinal direction of said mounting strip.

6. A mounting system according to claim 1 wherein said ordering assembly is formed as a single piece in an initial state thereof with the ordering segments lined up next to one another and comprises predetermined separation points equidistant and delimiting individual ones of said ordering segments.

7. A mounting system according to claim 6 wherein each said separation point is disposed in a fastening section of said ordering assembly fastening said ordering assembly to said mounting strip.

8. A mounting system according to claim 1 wherein each said ordering segment comprises a tool engagement surface on which a tool can be placed to detach the respective ordering segment from said mounting strip.

9. A mounting system according to claim 1 wherein each said tool engagement surface is located in a center of the respective ordering segment in the longitudinal direction of said mounting strip.

10. A mounting system according to claim 1 wherein each said ordering segment comprises a receiving channel receiving at least one of said connecting lines and comprises a deflectable leg disposed opposite said mounting strip allowing insertion of at least one of said connecting lines into the respective receiving channel.

11. A mounting system according to claim 10 wherein each said receiving channel extends across an entire length of the respective ordering segment.

12. A mounting system according to claim 1 wherein each said ordering segment comprises a holding section protruding diagonally relative to the longitudinal direction the mounting strip and coupling a cable holder to the respective ordering segment gripping the respective connecting line connected to the respective ordering segment.

13. A mounting system according to claim 12 wherein each said holding section protrudes perpendicularly relative to the longitudinal direction of the mounting strip.

14. A mounting system according to claim 12 wherein each said cable holder is a cable tie.

15. A mounting system according to claim 1 wherein at least one portion of said ordering segments has a length in the longitudinal direction of the mounting strip of less than 150 mm.

16. A mounting system according to claim 15 wherein the length is less than 100 mm.

17. A mounting system according to claim 16 wherein the length is less than 80 mm.

* * * * *